United States Patent
Patil

(10) Patent No.: US 9,595,495 B1
(45) Date of Patent: Mar. 14, 2017

(54) MULTI-LEVEL SIGNALING FOR ON-PACKAGE CHIP-TO-CHIP INTERCONNECT THROUGH SILICON BRIDGE

(71) Applicant: ALTERA CORPORATION, San Jose, CA (US)

(72) Inventor: Dinesh Patil, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/867,463

(22) Filed: Sep. 28, 2015

(51) Int. Cl.
H01L 23/538 (2006.01)
H03M 1/66 (2006.01)
H03M 1/12 (2006.01)

(52) U.S. Cl.
CPC .......... *H01L 23/5381* (2013.01); *H03M 1/12* (2013.01); *H03M 1/66* (2013.01)

(58) Field of Classification Search
CPC ............. H01L 23/5381; H01L 25/0655; H01L 25/072; H03M 1/12; H03M 1/66
See application file for complete search history.

(56) References Cited

U.S. PATENT DOCUMENTS

| | | | |
|---|---|---|---|
| 3,534,273 A | 10/1970 | Thomas | |
| 5,761,246 A | 6/1998 | Cao et al. | |
| 5,832,038 A | 11/1998 | Carsello | |
| 6,173,018 B1 | 1/2001 | Kuroki | |
| 6,198,779 B1 | 3/2001 | Taubenheim et al. | |
| 6,324,602 B1 | 11/2001 | Chen et al. | |
| 6,771,675 B1 | 8/2004 | Cao et al. | |
| 7,233,164 B2 | 6/2007 | Stojanovic et al. | |
| 7,795,915 B2 | 9/2010 | Candage et al. | |
| 8,022,726 B2 | 9/2011 | Candage et al. | |
| 8,026,740 B2 | 9/2011 | Hollis | |
| 8,548,071 B2 * | 10/2013 | Collins | H03K 19/17744 326/8 |
| 8,750,406 B2 | 6/2014 | Pan et al. | |
| 8,842,034 B1 * | 9/2014 | Gong | H03M 1/68 341/144 |
| 2004/0071203 A1 | 4/2004 | Gorecki | |
| 2005/0134307 A1 | 6/2005 | Stojanovic et al. | |
| 2008/0246752 A1 | 10/2008 | Lee | |
| 2009/0238300 A1 | 9/2009 | Hollis | |
| 2010/0026261 A1 | 2/2010 | Candage et al. | |
| 2011/0018517 A1 | 1/2011 | Candage et al. | |
| 2011/0311008 A1 | 12/2011 | Slezak et al. | |
| 2011/0316726 A1 | 12/2011 | Hollis | |
| 2016/0027482 A1 * | 1/2016 | DeLacruz | H01L 23/5381 365/219 |

* cited by examiner

*Primary Examiner* — Jeffrey Zweizig
(74) *Attorney, Agent, or Firm* — Okamoto & Benedicto LLP

(57) ABSTRACT

One embodiment relates to an apparatus for data communication between at least two in-package semiconductor dies. On the first semiconductor die in a package, a digital-to-analog converter (DAC) converts a plurality of binary signals to an analog signal. The analog signal is transmitted through a silicon bridge to a second semiconductor die. Another embodiment relates to a method of data communication between at least two in-package semiconductor dies. A plurality of binary signals is converted to an analog signal by a digital-to-analog converter on a first semiconductor die. The analog signal is transmitted through a silicon bridge to a second semiconductor die. Other embodiments, aspects and features are also disclosed.

13 Claims, 8 Drawing Sheets

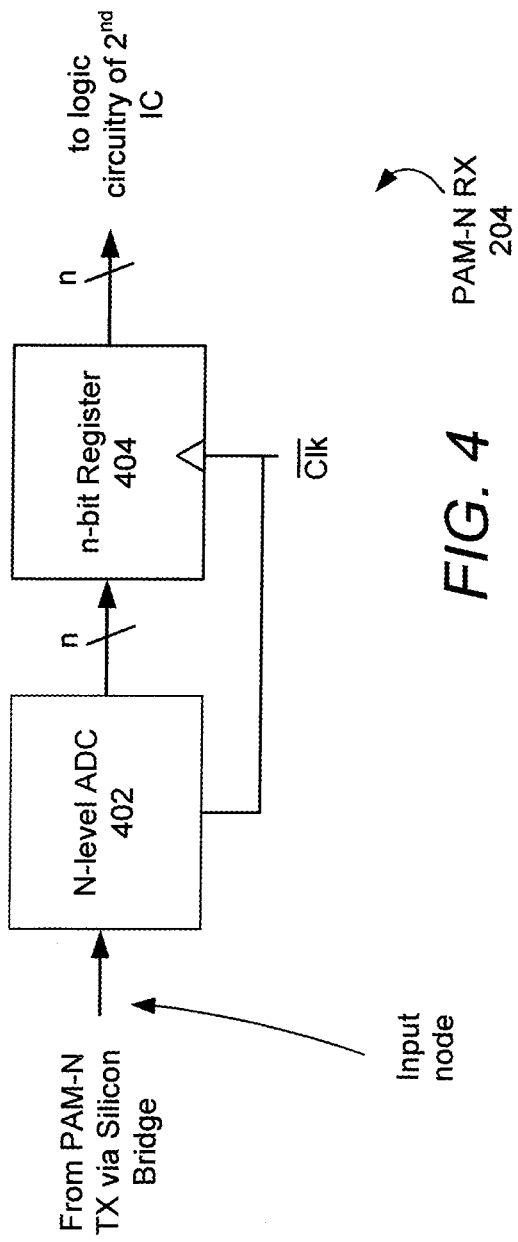

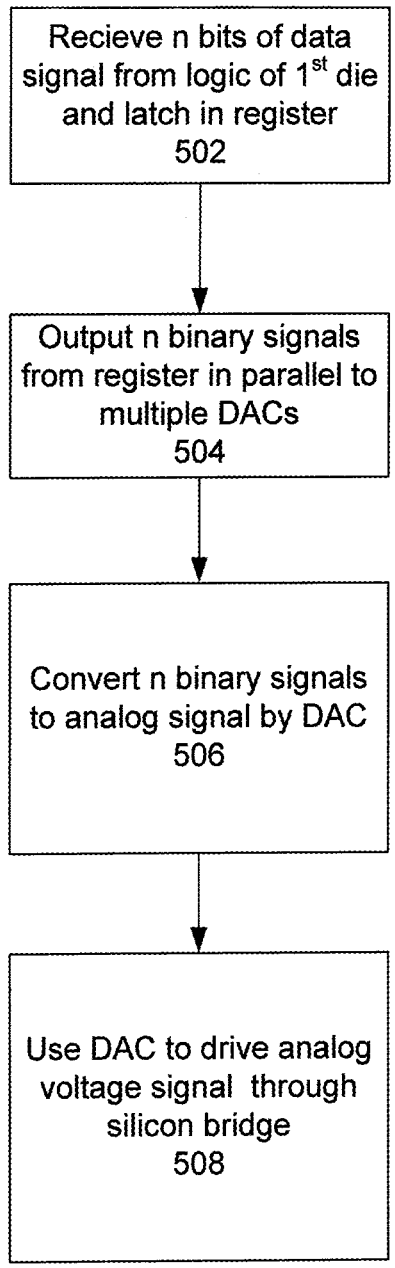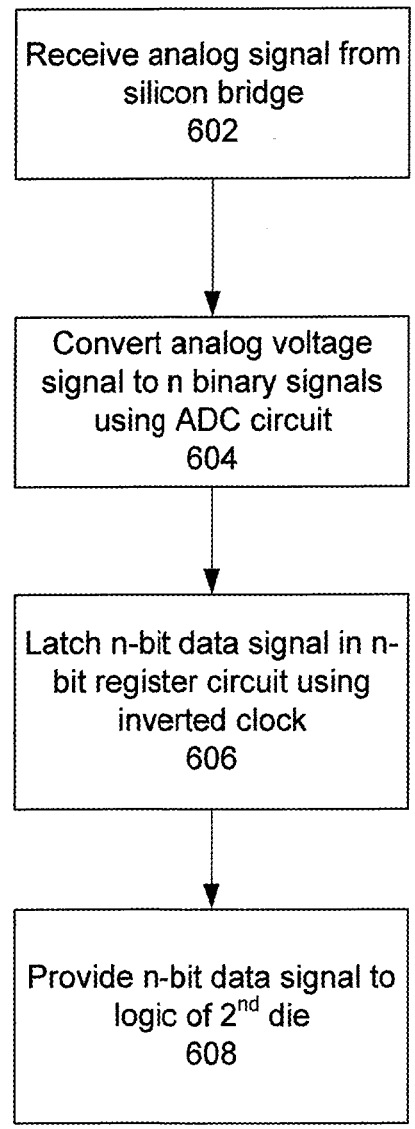
FIG. 5    500
FIG. 6    600

US 9,595,495 B1

MULTI-LEVEL SIGNALING FOR ON-PACKAGE CHIP-TO-CHIP INTERCONNECT THROUGH SILICON BRIDGE

BACKGROUND

Technical Field

The present invention relates generally to data communications. More particularly, the present invention relates to circuitry for data communications between integrated circuit devices.

Description of the Background Art

High-speed data links are used to communicate data between integrated circuit devices in a system. Serial interface protocols have been developed at increasingly fast data-rates for such high-speed links.

SUMMARY

One embodiment relates to an apparatus for data communication between at least two in-package semiconductor dies. On the first semiconductor die in a package, a digital-to-analog converter (DAC) converts a set of binary signals to an analog signal level (out of $2^n$ possibilities, for example). A silicon bridge transmits the analog signal to a second semiconductor die in the package.

Another embodiment relates to a method of data communication between at least two in-package semiconductor dies. A plurality of binary signals is converted to an analog signal by a digital-to-analog converter on a first semiconductor die. The analog signal is transmitted through a silicon bridge to a second semiconductor die.

Another embodiment relates to a system for transmitting a multiple-level data signal across an interposer from a first integrated circuit to a second integrated circuit. A first register on the first semiconductor die receives a multiple-bit data signal from logic circuitry on the first integrated circuit and outputs a plurality of binary signals. A digital-to-analog converter on the first integrated circuit each receives the plurality of binary signals, converts the plurality of binary signals to an analog signal, and drives the analog signal to an output node on the first integrated circuit. A connection is provided through the interposer between the output node of the first integrated circuit and an input node of the second integrated circuit.

Another embodiment relates to an apparatus for data communication between at least two in-package semiconductor dies. A first digital-to-analog converter on a first semiconductor die in a package converts a first plurality of binary signals to a first analog signal and drives the first analog signal to a silicon bridge. A first analog-to-digital converter on the first semiconductor die that receives a second analog signal from the silicon bridge and converts the second analog signal to a first plurality of recovered binary signals.

Another embodiment relates to a method for data communication between at least two in-package semiconductor dies. A plurality of binary signals are received from first logic circuitry in a first semiconductor die in a package. The plurality of binary signals are converted to a first analog signal using an digital-to-analog converter on the first semiconductor die. The first analog signal is driven from the first semiconductor die to a silicon bridge.

Other embodiments, aspects, and features are also disclosed.

BRIEF DESCRIPTION OF THE DRAWINGS

FIG. 4 is a block diagram of a PAM-N receiver circuit in accordance with an embodiment of the invention.

FIG. 5 is a flow chart of a method of transmitting a multi-level amplitude signal to a silicon bridge in accordance with an embodiment of the invention.

FIG. 6 is a flow chart of a method of receiving a multi-level amplitude signal from a silicon bridge in accordance with an embodiment of the invention.

DETAILED DESCRIPTION

Figure 1:
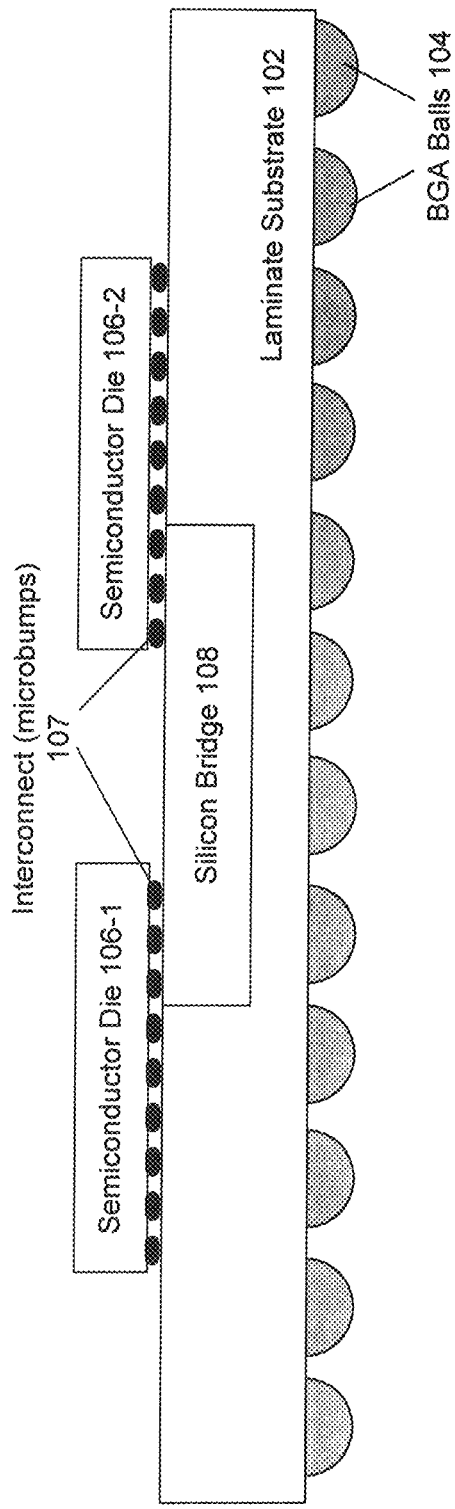
FIG. 1 is a schematic diagram illustrating two semiconductor dies interconnected through a silicon bridge in accordance with an embodiment of the invention.

The conventional wisdom is to use PAM-N signaling to lower the signaling baud rate for serial links when signal loss at higher baud rate is too high. In the case of interconnections through a silicon bridge (or other similar interposer), channel loss is generally very low. Hence, the conventional wisdom would be against using PAM-N signaling across a silicon bridge.

The presently-disclosed solution goes counter to this conventional wisdom and implements PAM-N signaling across a silicon bridge. This solution is based on the determination by the applicant that, despite no need to improve channel loss across a silicon bridge (or similar interposer), using PAM-N signaling simplifies and improves other different issues, specifically for a parallel interface. These issues include clock generation and distribution, cross talk, simultaneous switching noise, and pin-to-pin skew.

One embodiment of the invention relates to a packaged device containing multiple semiconductor die (integrated circuit chips) connected by an embedded silicon bridge (an interposer). For such a package device, increasing the interconnect bandwidth between the die (assuming binary signaling) either costs more micro-bumps of interconnect, or entails increasing the design complexity in the clocking network to support a higher data-rate (for example, to greater than one gigabits per second).

However, issues such as on-die variations, pin-to-pin skew, duty cycle variations, high-speed clock generation and distribution and so on, cost additional area and power to accommodate. These costs offset the noise benefits of simple binary signaling.

The present solution uses a data signal with multiple (three or more) logical levels on one lane to transfer more than one bit of data per symbol on the lane. A lane may correspond to a micro-bump for a single-ended signal or a pair of micro-bumps for a differential signal. Hence, in this solution, for a given aggregate data-rate, sending more than one bit per symbol for each lane enables using fewer micro-bumps for the same baud-rate. Alternatively, for a given aggregate data-rate, sending more than one bit per symbol for each lane enables running at a lower baud-rate for the same number of micro-bumps.

One specific implementation uses a 4-level transmit digital-to-analog converter (DAC) to send, and a 4-level receive analog-to-digital converter (ADC) to receive, two bits per symbol for each lane. Another specific implementation uses an 8-level transmit DAC to send, and an 8-level receive ADC to receive, three bits per symbol for each lane. Another specific implementation uses a 16-level transmit DAC to send, and an 16-level receive ADC to receive, four bits per symbol for each lane.

Advantageously, using a lower baud-rate simplifies clocking and mitigates concerns over on-chip pin-to-pin skew, power supply noise, and duty cycle variations. In addition, the lower baud-rate allows using simpler circuits to decode the data. Hence, this solution not only reduces symbol interference, but it may also lead to reduction of the overall area and/or number of micro-bumps (interconnections) needed for a given data-rate.

FIG. 1 is a schematic diagram illustrating two semiconductor dies (106-1 and 106-2) interconnected through a silicon bridge 108 in accordance with an embodiment of the invention. As shown, the two semiconductor dies (integrated circuit chips) may be interconnected with micro-bump interconnections 107 to circuitry on a laminate substrate 102.

As further shown, the laminate substrate 102 may include an embedded silicon bridge 108 that acts as an interposer between the two semiconductor dies (106-1 and 106-2). The micro-bumps 107 may be used to interconnect circuitry on each of the semiconductor dies with circuitry on the silicon bridge 108. As described further below, the two semiconductor dies (106-1 and 106-2) may communicate by way of a multiple-lane data channel that goes through the silicon bridge 108.

Figure 2A:
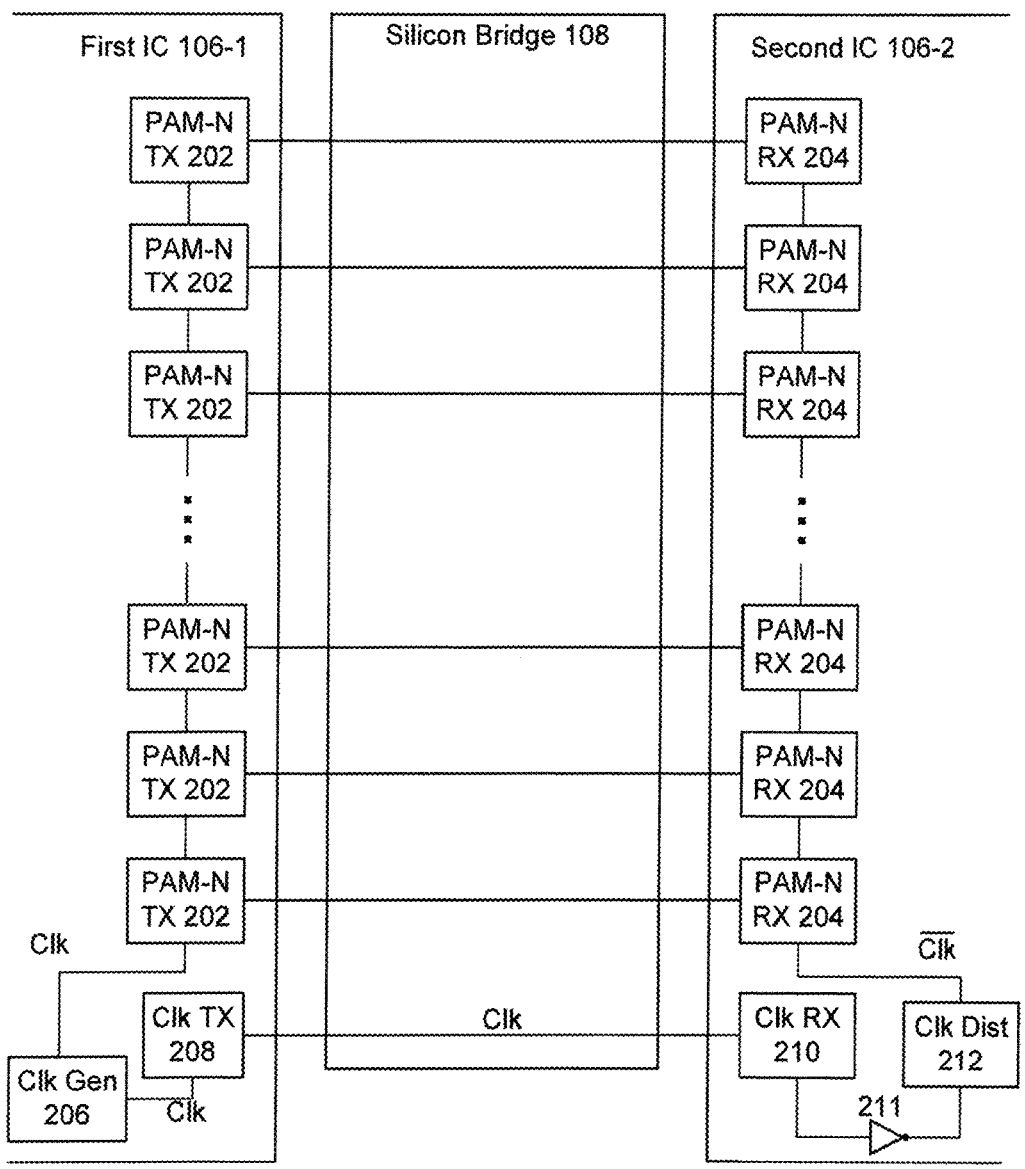
FIG. 2A is a block diagram depicting multiple PAM-N transmitter circuits of a first semiconductor die connecting via a silicon bridge to multiple PAM-N receiver circuits of a second semiconductor die in accordance with an embodiment of the invention.

FIG. 2A is a block diagram depicting multiple PAM-N transmitter circuits 202 of a first semiconductor die 106-1 connecting via a silicon bridge 108 to multiple PAM-N receiver circuits 204 of a second semiconductor die 106-2 in accordance with an embodiment of the invention. As discussed above, N is three or greater such that more than one bit is transmitted per symbol. In preferred embodiments, N is 4, 8, 16, etc. In other words, in a preferred embodiment $N=2^n$, where n is an integer that is two or more. An implementation of a PAM-N transmitter circuit 202 is described below in relation to FIG. 3, and an implementation of a PAM-N receiver circuit 204 is described below in relation to FIG. 4.

As further shown in FIG. 2A, a clock generation circuit 206 on the first semiconductor die 106-1 may generate the clock signal Clk, which may be distributed to each of the PAM-N transmitter circuits 202 and to a clock transmitter circuit 208. The clock signal Clk may be a CMOS clock signal, for example. The PAM-N transmitter circuits 202 may use the clock signal Clk to determine the baud-rate and timing for data transmission via the multiple lanes. The clock transmitter (Clk TX) circuit 208 on the first semiconductor die 106-1 may be used to transmit the clock signal Clk via the silicon bridge 108 to the second semiconductor die 106-2.

The clock signal Clk may be received by the clock receiver (Clk RX) circuit on the second semiconductor die 106-2. An inverter circuit 211 may be used to generate the inverted clock signal $\overline{\text{Clk}}$, and clock distribution circuitry 212 may distribute the inverted clock signal $\overline{\text{Clk}}$ to the PAM-N receiver circuits 204 on the second semiconductor die 106-2. The PAM-N receiver circuits 204 may use the inverted clock signal $\overline{\text{Clk}}$ to determine the timing for data reception on the multiple lanes.

The clock edges that are 180 degrees apart may be used to time symbol transitions by a transmitter circuit 202 and to sample the data signal by a corresponding receiver circuit 204. For example, if the rising edge of the clock signal Clk may be used to time the transitions between symbols by the PAM-N transmitter circuit 202, then the rising edge of the inverted clock signal $\overline{\text{Clk}}$ may be used for sampling data by a PAM-N receiver circuit 204.

Figure 2B:
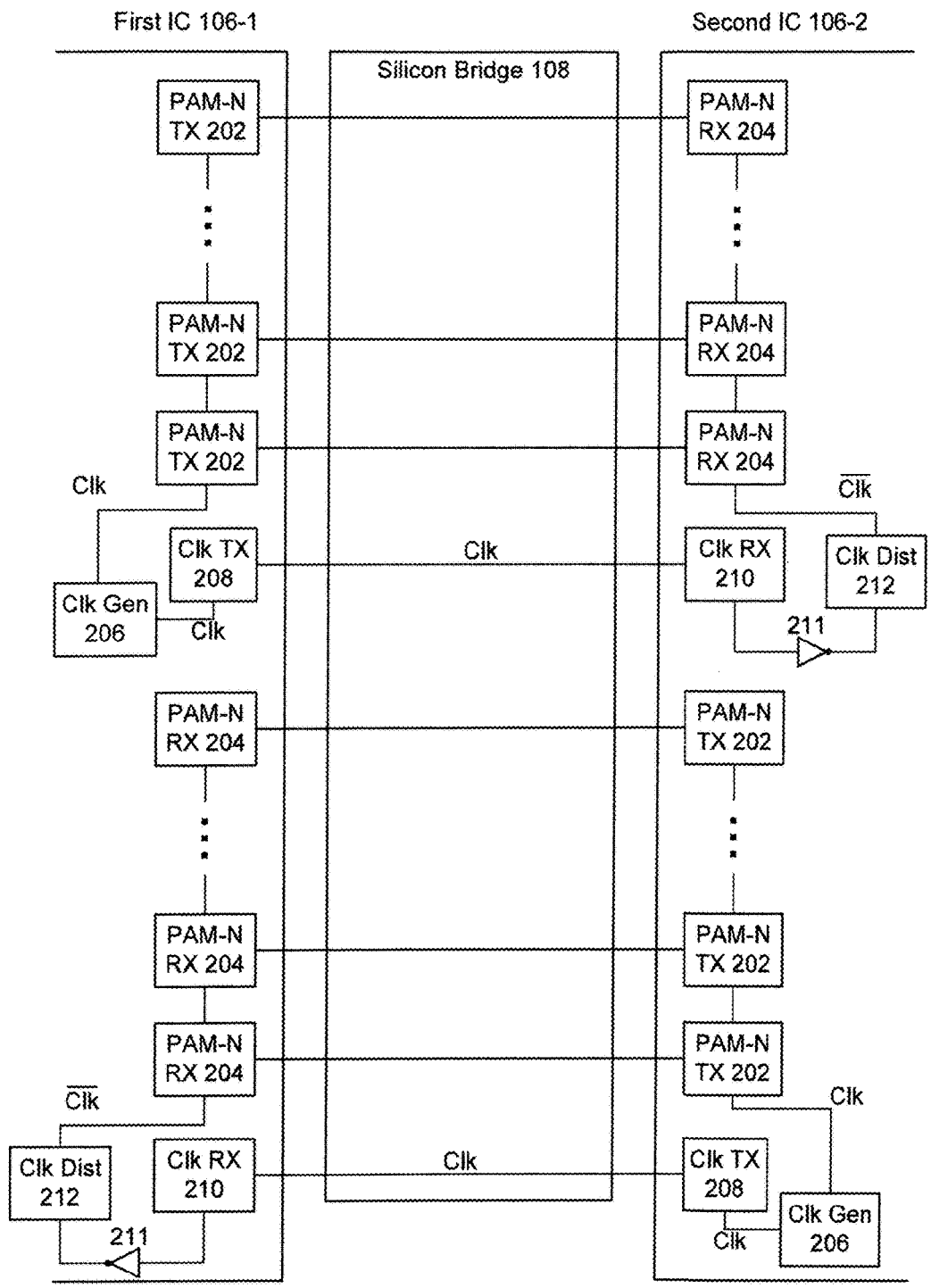
FIG. 2B is a block diagram depicting multiple PAM-N transmitter circuits of a first semiconductor die connecting via a silicon bridge to multiple PAM-N receiver circuits of a second semiconductor die and multiple PAM-N transmitter circuits of the second semiconductor die connecting via the silicon bridge to multiple PAM-N receiver circuits of the first semiconductor die in accordance with an embodiment of the invention.

FIG. 2B is a block diagram depicting multiple PAM-N transmitter circuits 202 of a first semiconductor die 106-1 connecting via a silicon bridge 108 to multiple PAM-N receiver circuits 104 of a second semiconductor die 106-2 and multiple PAM-N transmitter circuits 202 of the second semiconductor die 106-2 connecting via the silicon bridge 108 to multiple PAM-N receiver circuits 104 of the first semiconductor die 106-1 in accordance with an embodiment of the invention. The circuits in FIG. 2B operate as described above in relation to FIG. 2A. However, while FIG. 2A provides one-way communication from the first semiconductor die 106-1 to the second semiconductor die 106-2, FIG. 2B provides bi-directional communication between the first and second semiconductor dies.

Figure 3:
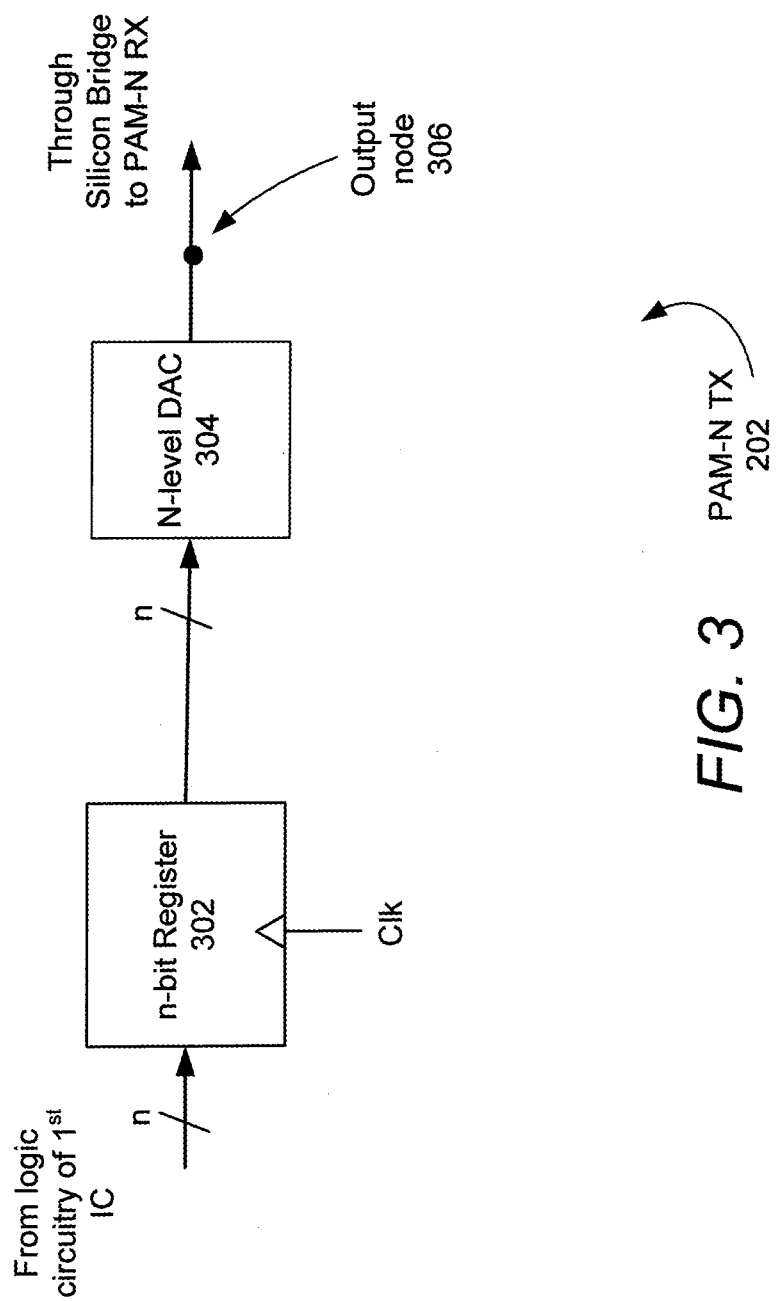
FIG. 3 is a block diagram of a PAM-N transmitter circuit in accordance with an embodiment of the invention.

FIG. 3 is a block diagram of a PAM-N transmitter circuit 202 on the first semiconductor die 106-1 in accordance with an embodiment of the invention. As shown, the PAM-N transmitter circuit 202 may include an n-bit register circuit 302 and a N-level digital-to-analog converter (DAC) circuit 304. In a preferred embodiment, $N=2^n$, where n is an integer that is two or more.

The n-bit register circuit 302 may receive and latch n bits of data. The data may be received in parallel from logic circuitry on the first semiconductor die 106-1. The timing for the n-bit register circuit 302 may be provided by a clock edge (for example, the rising edge) of the clock signal Clk, described above in relation to FIG. 2A.

The n binary signals output from the n-bit register circuit 302 may be provided to the N-level DAC circuit 304. The N-level DAC circuit 304 may convert the n binary signals to an analog signal.

The amplitude of the analog signal that is output by each of the N-level DAC circuit 304 depends on the values of the n bits. For example, with n=4 and $N=2^4=16$, the output range of the analog signal may be 0 volts to 1.5 volts in steps of 100 millivolts. For example: if the 4 binary signals are 0000, then the analog signal may be 0 volts; if the 4 binary signals are logical 0001, then the analog signal may be 0.1 volts; if the 4 binary signals are logical 0010, then the analog signal may be 0.2 volts; if the 4 binary signals are logical 0011, then the analog signal may be 0.3 volts; . . . ; if the 4 binary signals are logical 1111, then the analog signal may be 1.5 volts.

The analog signal goes from the output node 306 through the silicon bridge 108 to a corresponding PAM-N receiver circuit 204 on the second semiconductor die 106-2.

In one embodiment, PAM-16 may be implemented such that one lane carries four bits. Specific multiple-lane implementations to achieve an aggregate data rate of 32 Gbps may be as follows: 16 lanes of PAM-16 with a 500 MHz clock; or 8 lanes of PAM-16 with a 1 GHz clock; or 4 lanes of PAM-16 with a 2 GHz clock.

Advantageously, with simplified clocking, power may be scaled with the data rate. In particular, the driver circuits may be made slower with lower power for lower data rates.

FIG. 4 is a block diagram of a PAM-N receiver circuit 204 on the second semiconductor die 106-2 in accordance with an embodiment of the invention. As shown, the PAM-N receiver circuit 204 may include an N-level analog-to-digital converter (ADC) circuit 402, and an n-bit register circuit 404. In a preferred embodiment, $N=2^n$, where n is an integer that is two or more.

The analog data signal may be received by the N-level ADC circuit 402. The N-level ADC circuit 402 may be implemented with N−1 comparators, and the structure of the N-level ADC circuit 402 may be flashed or pipelined.

The N-level ADC circuit 402 converts the analog signal to n recovered binary signals. The n recovered binary signals may be provided in parallel to, and sampled by, the n-bit register circuit 404 to recover an n-bit data signal. The timing for the sampling may be provided by a clock edge (for example, the rising edge) from the inverted clock signal $\overline{Clk}$, described above in relation to FIG. 2A.

Finally, the n-bit register circuit 404 may output the recovered n-bit data signal in parallel to logic circuitry on the second semiconductor die 106-2 for further processing and use.

FIG. 5 is a flow chart of a method 500 of transmitting a multi-level amplitude signal to a silicon bridge in accordance with an embodiment of the invention. The method may be performed by using a PAM-N transmitter 202 of the first semiconductor die 106-1.

Per step 502, n bits of a data signal received from logic circuitry of the first semiconductor die 106-1 and latched by the n-bit register circuit 302. Subsequently, per step 504, the n-bit register circuit 302 may output n binary signals corresponding to the n bits.

Per step 506, the n binary signals may be converted to an analog signal. As described above in relation to FIG. 3, the conversion may be performed by aDAC circuit. Per step 508, the output of the DAC circuit may be combined and switched simultaneously to drive the analog signal from the first die 106-1 through the silicon bridge to the second die 106-2.

FIG. 6 is a flow chart of a method 600 of receiving a multi-level amplitude signal from a silicon bridge in accordance with an embodiment of the invention. The method 600 may be performed by using a PAM-N receiver 204 of the second semiconductor die 106-2. Before the method 600, each comparator may be calibrated for offset correction.

Per step 602, the analog data signal may be received by an N-level ADC circuit 402. The N-level ADC circuit 402 may be implemented with N−1 comparators, and the structure of the N-level ADC circuit 402 may be flashed or pipelined.

Per step 604, the analog signal may be converted to n recovered binary signals. Per step 606, the n recovered binary signals may be provided in parallel to, and sampled by, the n-bit register circuit 404 to recover an n-bit data signal. The timing for the sampling may be provided by a clock edge (for example, the rising edge) from the inverted clock signal $\overline{Clk}$, described above in relation to FIG. 2.

Finally, per step 608, the recovered n-bit data signal may be output from the n-bit register circuit 404 in parallel to logic circuitry on the second semiconductor die 106-2 for further processing and use.

Figure 7:
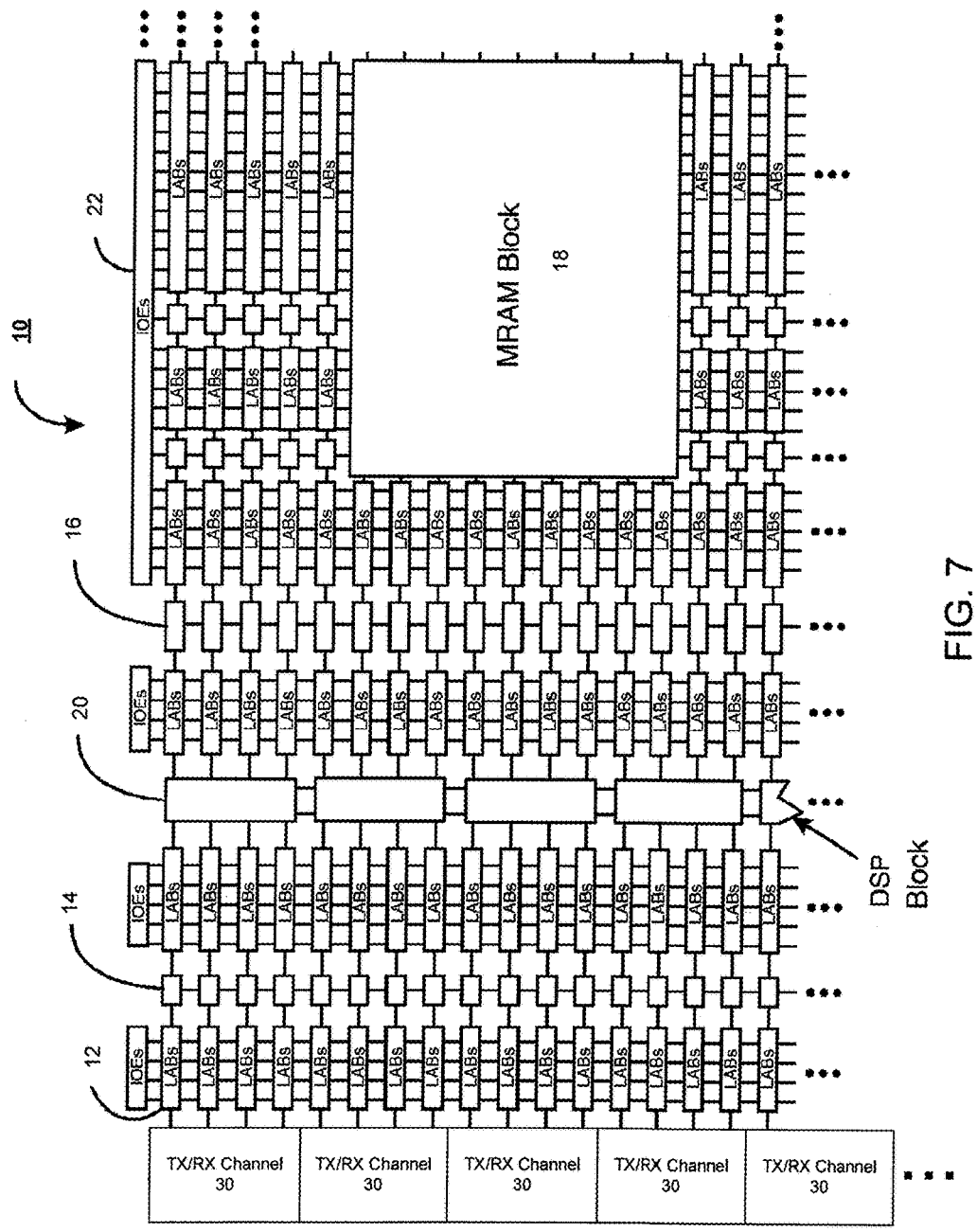
FIG. 7 is a simplified partial block diagram of a field programmable gate array that may be arranged or configured to include one or more of the circuits disclosed herein in accordance with an embodiment of the invention.

FIG. 7 is a simplified partial block diagram of a field programmable gate array (FPGA) 10 that may be arranged or configured to include one or more of the circuits disclosed herein in accordance with an embodiment of the invention. It should be understood that embodiments of the present invention may be used in numerous types of integrated circuits, including FPGAs, programmable logic devices (PLDs), complex programmable logic devices (CPLDs), programmable logic arrays (PLAs), digital signal processors (DSPs) and application specific integrated circuits (ASICs).

FPGA 10 includes within its "core" a two-dimensional array of programmable logic array blocks (or LABs) 12 that are interconnected by a network of column and row interconnect conductors of varying length and speed. LABs 12 include multiple (e.g., ten) logic elements (or LEs). An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 10 may also include a distributed memory structure including random access memory (RAM) blocks of varying sizes provided throughout the array. The RAM blocks include, for example, blocks 14, blocks 16, and block 18. These memory blocks can also include shift registers and FIFO buffers. FPGA 10 may further include digital signal processing (DSP) blocks 20 that can implement, for example, multipliers with add or subtract features.

Input/output elements (IOEs) 22 located, in this example, around the periphery of the chip support numerous single-ended and differential input/output standards. Each IOE 22 is coupled to an external terminal (i.e., a pin) of FPGA 10. A transceiver (TX/RX) channel array may be arranged as shown, for example, with each TX/RX channel circuit 30 being coupled to several LABs. A TX/RX channel circuit 30 may include, among other circuitry, the transmitter and receiver circuitry described herein.

It is to be understood that FPGA 10 is described herein for illustrative purposes only and that the present invention can be implemented in many different types of PLDs, FPGAs, and ASICs.

Figure 8:
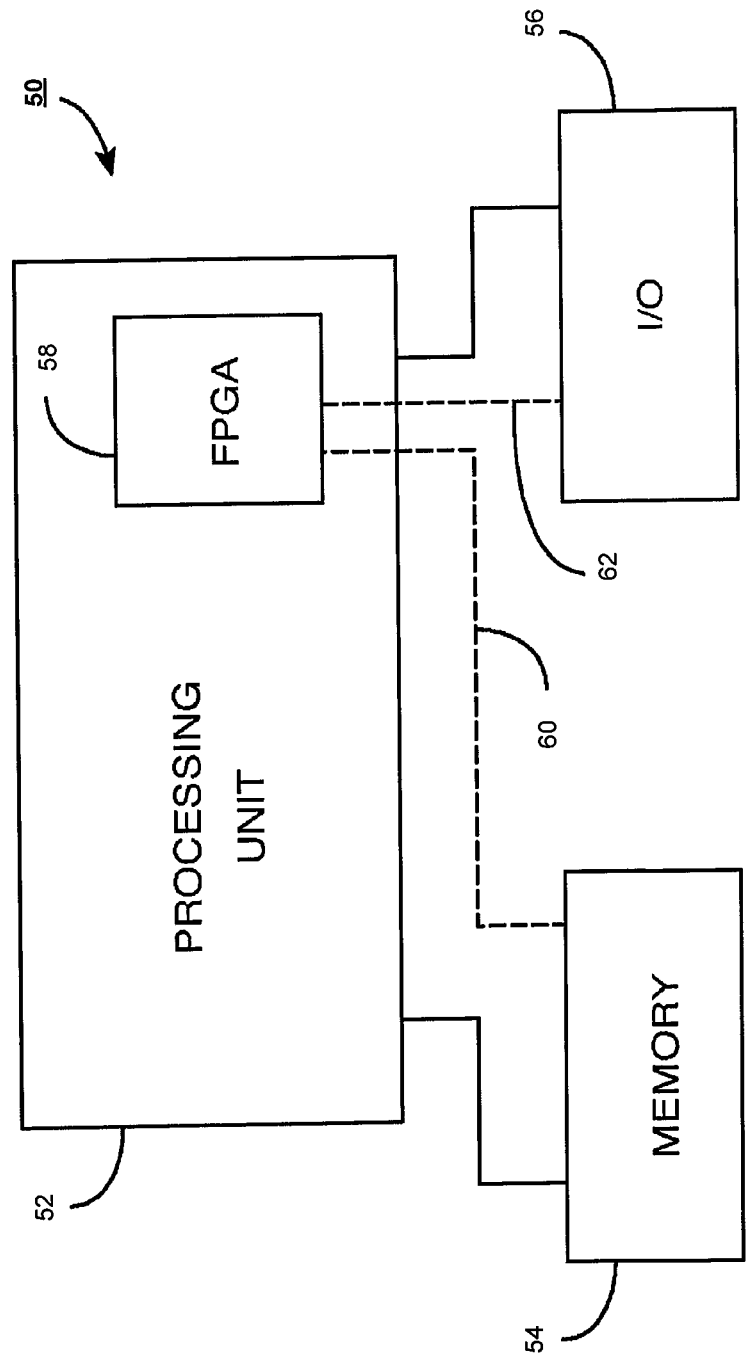
FIG. 8 is a block diagram of an exemplary digital system that may employ a multi-level signaling data link in accordance with an embodiment of the invention.

FIG. 8 is a block diagram of an exemplary digital system 50 that may employ multi-level amplitude signaling in accordance with an embodiment of the invention. As shown, system 50 may include an FPGA as one of several components.

System 50 may be, for example, a programmed digital computer system, digital signal processing system, specialized digital switching network, or other processing system. System 50 may be designed for a wide variety of applications such as telecommunications systems, automotive systems, control systems, consumer electronics, personal computers, Internet communications and networking, and others. Further, system 50 may be provided on a single board, on multiple boards, or within multiple enclosures.

As shown, system 50 includes a processing unit 52, a memory unit 54, and an input/output (I/O) unit 56 interconnected together by one or more buses. According to this exemplary embodiment, FPGA 58 is embedded in processing unit 52. FPGA 58 may serve many different purposes within the system 50. FPGA 58 may, for example, be a logical building block of processing unit 52, supporting its internal and external operations. FPGA 58 is programmed to implement the logical functions necessary to carry on its particular role in system operation. FPGA 58 can be specially coupled to memory 54 through connection 60 and to I/O unit 56 through connection 62.

Processing unit 52 may direct data to an appropriate system component for processing or storage, execute a program stored in memory 54, receive and transmit data via I/O unit 56, or other similar function. Processing unit 52 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 58 may control the logical operations of the system. As another example, FPGA 58 acts as a reconfigurable processor that may be reprogrammed as needed to handle a particular computing task. Alternately, FPGA 58 may itself include an embedded microprocessor. Memory unit 54 may be a random access memory (RAM), read only memory (ROM), fixed or flexible disk media, flash memory, tape, or any other storage means, or any combination of these storage means.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. An apparatus for data communication between at least two in-package semiconductor dies, the apparatus comprising:
    an digital-to-analog converter on a first semiconductor die in a package that converts a plurality of binary signals to an analog signal and drives the analog signal; and
    a silicon bridge for receiving the analog signal from the first semiconductor die and transmitting the analog signal to a second semiconductor die in the package; and
    an analog-to-digital converter on the second semiconductor die that receives the analog signal from the silicon bridge and converts the analog signal to a plurality of recovered binary signals.

2. The apparatus of claim 1, wherein the plurality of binary signals comprises n binary signals, where n is an integer that is two or more, and wherein the digital-to-analog converter comprises an N-level digital-to-analog converter, where $N=2^n$.

3. The apparatus of claim 1, further comprising:
    a first register on the first semiconductor die that receives a multiple-bit data signal from logic circuitry on the first semiconductor die and outputs the plurality of binary signals to the digital-to-analog converter.

4. The apparatus of claim 1, further comprising:
    a first register on the first semiconductor die that receives a multiple-bit data signal from logic circuitry on the first semiconductor die and outputs the plurality of binary signals to the digital-to-analog converter; and
    a second register on the second semiconductor die that receives the plurality of recovered binary signals from the analog-to-digital converter and outputs an multiple-bit recovered data signal to logic circuitry on the second semiconductor die.

5. The apparatus of claim 4, further comprising:
    a clock transmitter on the first semiconductor die that transmits a clock signal through the silicon bridge to the second semiconductor die; and
    a clock receiver on the second semiconductor die that receives the clock signal.

6. The apparatus of claim 5, wherein the clock signal is provided to the first register and provides timing for switching the binary signals.

7. The apparatus of claim 6, further comprising:
    an inverter on the second semiconductor die that receives the clock signal and outputs an inverted clock signal, wherein the inverted clock signal is provided to the analog-to-digital converter and provides timing for sampling the analog signal.

8. A method of data communication between at least two in-package semiconductor dies, the method comprising:
    receiving by a first register a multiple-bit data signal from logic circuitry on a first semiconductor die;
    outputting the plurality of binary signals to a digital-to-analog converter;
    converting a plurality of binary signals to an analog signal by the digital-to-analog converter on the first semiconductor die in a package;
    transmitting the analog signal through a silicon bridge to a second semiconductor die in the package;
    converting the analog signal to a plurality of recovered binary signals by an analog-to-digital converter on the second semiconductor die;
    receiving by a second register the plurality of recovered binary signals from the analog-to-digital converter; and
    outputting an multiple-bit recovered data signal to logic circuitry on the second semiconductor die.

9. The method of claim 8, wherein the plurality of binary signals comprises n binary signals, where n is an integer that is two or more, and wherein the digital-to-analog converter comprises an N-level digital-to-analog converter, where $N=2^n$.

10. The method of claim 8, further comprising:
    transmitting a clock signal through the silicon bridge to the second semiconductor die by a clock transmitter on the first semiconductor die; and
    receiving the clock signal by a clock receiver on the second semiconductor die.

11. The method of claim 10, wherein the clock signal is provided to the first register and provides timing for switching the binary signals.

12. The method of claim 11, further comprising:
    receiving the clock signal and outputting an inverted clock signal by an inverter on the second semiconductor die; and
    using the inverted clock signal by the second register to provide timing for sampling of the analog signal.

13. An apparatus for data communication between at least two in-package semiconductor dies, the apparatus comprising:
- a first digital-to-analog converter on a first semiconductor die in a package that converts a first plurality of binary signals to a first analog signal and drives the first analog signal to a silicon bridge;
- a first analog-to-digital converter on the first semiconductor die that receives a second analog signal from the silicon bridge and converts the second analog signal to a first plurality of recovered binary signals;
- a second digital-to-analog converter on a second semiconductor die in the package that converts a second plurality of binary signals to the second analog signal and drives the second analog signal to the silicon bridge; and
- a second analog-to-digital converter on the second semiconductor die that receives the first analog signal from the silicon bridge and converts the first analog signal to a second plurality of recovered binary signals.

* * * * *